(12) United States Patent
Carson et al.

(10) Patent No.: US 11,698,134 B2
(45) Date of Patent: Jul. 11, 2023

(54) SEAL RETAINER FOR A COMPONENT ASSEMBLY AND METHOD OF INSTALLING A COMPONENT INTO AN APPARATUS FOR CONTROLLING FLOW

(71) Applicant: Ichor Systems, Inc., Fremont, CA (US)

(72) Inventors: Stephen Carson, Woodstock, NY (US); Randolph Treur, San Luis Obispo, CA (US)

(73) Assignee: Ichor Systems, Inc.

( * ) Notice: Subject to any disclaimer, the term of this patent is extended or adjusted under 35 U.S.C. 154(b) by 101 days.

(21) Appl. No.: 17/318,241

(22) Filed: May 12, 2021

(65) Prior Publication Data

US 2021/0356041 A1  Nov. 18, 2021

Related U.S. Application Data

(60) Provisional application No. 63/023,742, filed on May 12, 2020.

(51) Int. Cl.
| | |
|---|---|
| *B23P 19/10* | (2006.01) |
| *H01L 21/67* | (2006.01) |
| *F16J 15/06* | (2006.01) |
| *F16J 15/10* | (2006.01) |

(52) U.S. Cl.
CPC ............. *F16J 15/061* (2013.01); *B23P 19/10* (2013.01); *F16J 15/104* (2013.01); *H01L 21/67017* (2013.01); *Y10T 29/494* (2015.01); *Y10T 29/49947* (2015.01)

(58) Field of Classification Search
CPC ......... F16J 15/061; F16J 15/104; F16J 15/106
See application file for complete search history.

(56) References Cited

U.S. PATENT DOCUMENTS

| | | | |
|---|---|---|---|
| 4,607,402 A | 8/1986 | Pollard | |
| 6,945,539 B2 | 9/2005 | Whitlow et al. | |
| 2002/0000256 A1* | 1/2002 | Eidsmore | F16K 27/003 |
| | | | 137/884 |
| 2008/0128303 A1* | 6/2008 | Phillips | G03F 1/66 |
| | | | 430/5 |

(Continued)

FOREIGN PATENT DOCUMENTS

| | | |
|---|---|---|
| KR | 10-0816263 | 3/2008 |
| WO | WO2007/083203 | 7/2007 |

OTHER PUBLICATIONS

International Search Report and Written Opinion issued in corresponding PCT International Application No. PCT/US2021/031937, dated Aug. 11, 2021, pp. 1-11.

*Primary Examiner* — Jason L Vaughan
*Assistant Examiner* — Amanda Kreiling
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow require a variety of fluid flow components which are tightly packaged within the apparatuses for controlling flow. Servicing the apparatuses requires specialized equipment and methods which enable installation of seals in close quarters in apparatuses which are installed in the field. Seal retainers may be used to retain the seals during assembly of fluid flow components into apparatus for controlling flow.

11 Claims, 17 Drawing Sheets

(56) References Cited

U.S. PATENT DOCUMENTS

2008/0302426 A1* 12/2008 Mulligan .............. F16K 27/003
                                                                               137/271
2010/0313976 A1    12/2010  Vu
2017/0057028 A1     3/2017  Kellogg et al.

* cited by examiner

SEAL RETAINER FOR A COMPONENT ASSEMBLY AND METHOD OF INSTALLING A COMPONENT INTO AN APPARATUS FOR CONTROLLING FLOW

CROSS-REFERENCE TO RELATED APPLICATIONS

This application claims the benefit of U.S. Provisional Application 63/023,742, filed May 12, 2020, which is incorporated herein by reference in its entirety.

BACKGROUND

Flow control has been one of the key technologies in semiconductor chip fabrication. Apparatuses for controlling fluid flow are important for delivering known flow rates of process fluids for semiconductor fabrication and other industrial processes. Such devices are used to measure and accurately control the flow of fluids for a variety of applications. This control relies on apparatuses which have components that are quickly and reliably assembled with minimal seal leakage.

As the technology of chip fabrication has improved, the component size has decreased and packaging requirements have become tighter for the apparatuses for controlling flow. Maintenance and repair of apparatuses for controlling flow increasingly involves installing seals and components in tight quarters. In order to improve the speed and ease of maintenance, improved methods and equipment are desired.

BRIEF SUMMARY

The present technology is directed to a seal retainer for use in assembling a seal and a component to a component mounting location in an apparatus for controlling flow. One or more of the seal retainers may be used on a single component and the resulting apparatuses for controlling flow may be used in a wide range of processes such as semiconductor chip fabrication, solar panel fabrication, and the like.

In one implementation, the invention is a method of installing a fluid flow component in an apparatus for controlling flow. In a first step, a seal is positioned into a first seal retainer to form a seal assembly. Second, the seal assembly is installed onto the fluid flow component so that the first seal is aligned with a first seal cavity of the fluid flow component, thereby forming a component assembly. Third, the component assembly is positioned atop a first substrate block of the apparatus for controlling flow so that the first seal is aligned with a first seal cavity of the first substrate block and a portion of the first seal retainer is positioned between the first substrate block and the fluid flow component. Fourth, the component assembly is partially fastened to the apparatus for controlling flow so that the first seal is at least partially disposed within each of the first seal cavity of the first substrate block and the first seal cavity of the fluid flow component. Fifth, the first seal retainer is retracted so that the first seal retainer is released from the fluid flow component and the portion of the first seal retainer is removed from between the first substrate block and the fluid flow component. Sixth, the component assembly is completely fastened to the apparatus for controlling flow.

In yet another implementation, the invention is a method of manufacturing semiconductors or integrated circuits. First, a fluid flow component of an apparatus for controlling flow is installed according to the method discussed above to complete a fluid supply line that extends from a fluid source to a process chamber. Second, fluid is flowed from the fluid source to the process chamber to contact one or more semiconductor or integrated circuit wafers in the process chamber.

In another implementation, the invention is a seal retainer for retaining a seal, the seal retainer having a sheet body. The sheet body has a first axis, a second axis perpendicular to the first axis, a first portion, and a second portion. The first axis is coplanar with the first portion and the first portion is elongate in a direction of the first axis and extends from the second axis along the first axis. The second portion extends from the second axis and has a seal retaining feature.

In yet another implementation, the invention is a fluid flow component assembly, the fluid flow component assembly having a fluid flow component, an alignment feature, a first seal, and a first seal retainer. The fluid flow component has a first seal cavity. The alignment feature is in contact with the fluid flow component. The first seal is configured to engage the first seal cavity. The first seal retainer is configured to engage the first seal and the alignment feature of the fluid flow component. The first seal is assembled to the first seal retainer so that the first seal is in contact with the first seal cavity.

In an alternate implementation, the invention is a method of installing a fluid flow component to an apparatus for controlling flow. First a component assembly is positioned atop a first substrate block, the component assembly comprising a fluid flow component, a first seal retainer, and a first seal retained by the first seal retainer in alignment with a first seal cavity of the fluid flow component. The component assembly is positioned atop the first substrate block so that the first seal is aligned with a first seal cavity of the first substrate block. Second, the first seal retainer is retracted so that the first seal retainer is released from the fluid flow component while the first seal and the fluid flow component remain in position. Third, the fluid flow component is fastened to the apparatus for controlling flow so that the first seal hermetically seals a flow path of the first substrate block to a flow path of the fluid flow component.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

Figure 1:
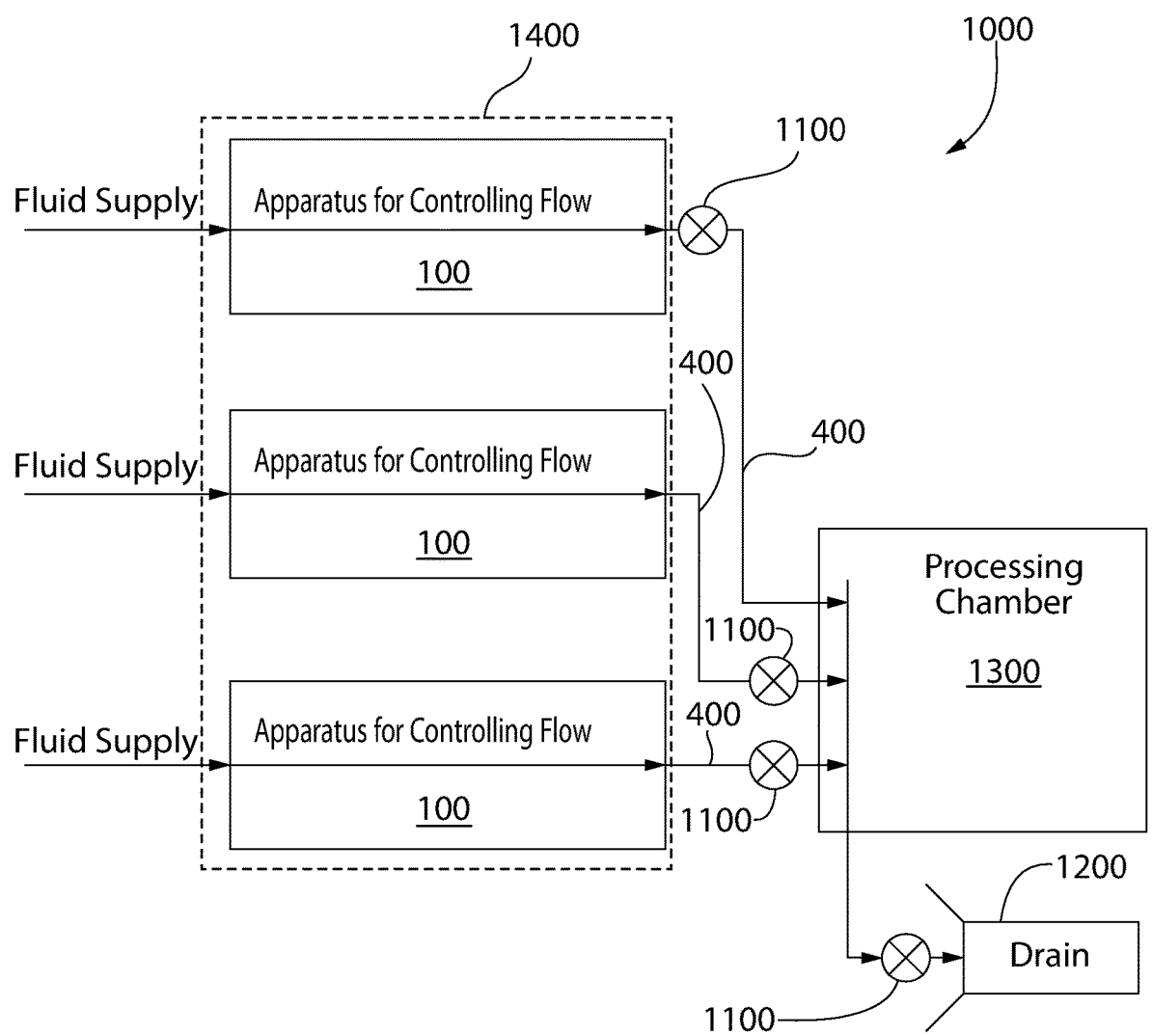
FIG. 1 is a schematic of a system for manufacturing semiconductor devices utilizing one or more apparatuses for controlling flow.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a seal retainer for use in installing fluid flow components to form a flow control apparatus. Semiconductor fabrication is one industry which demands high performance in control of fluid flows. As semiconductor fabrication techniques have advanced, customers have recognized the need for flow control devices with decreased space requirements. Thus, servicing and maintenance of flow control equipment has grown increasingly difficult as packaging of flow control devices grows denser than ever. The present invention facilitates efficient assembly of a flow control component within a flow control apparatus.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies, or fluid sources. Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a drain 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Optionally, the drain 1200 may be a source of vacuum or may be a liquid drain configured to remove liquids from the processing chamber 1300. Optionally, the apparatus for controlling flow 100 may be mass flow controllers, flow splitters, or any other device which controls the flow of a process fluid in a processing system. Furthermore, the valves 1100 may be integrated into the apparatus for controlling flow 100 if so desired.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing fluids.

Figure 2:
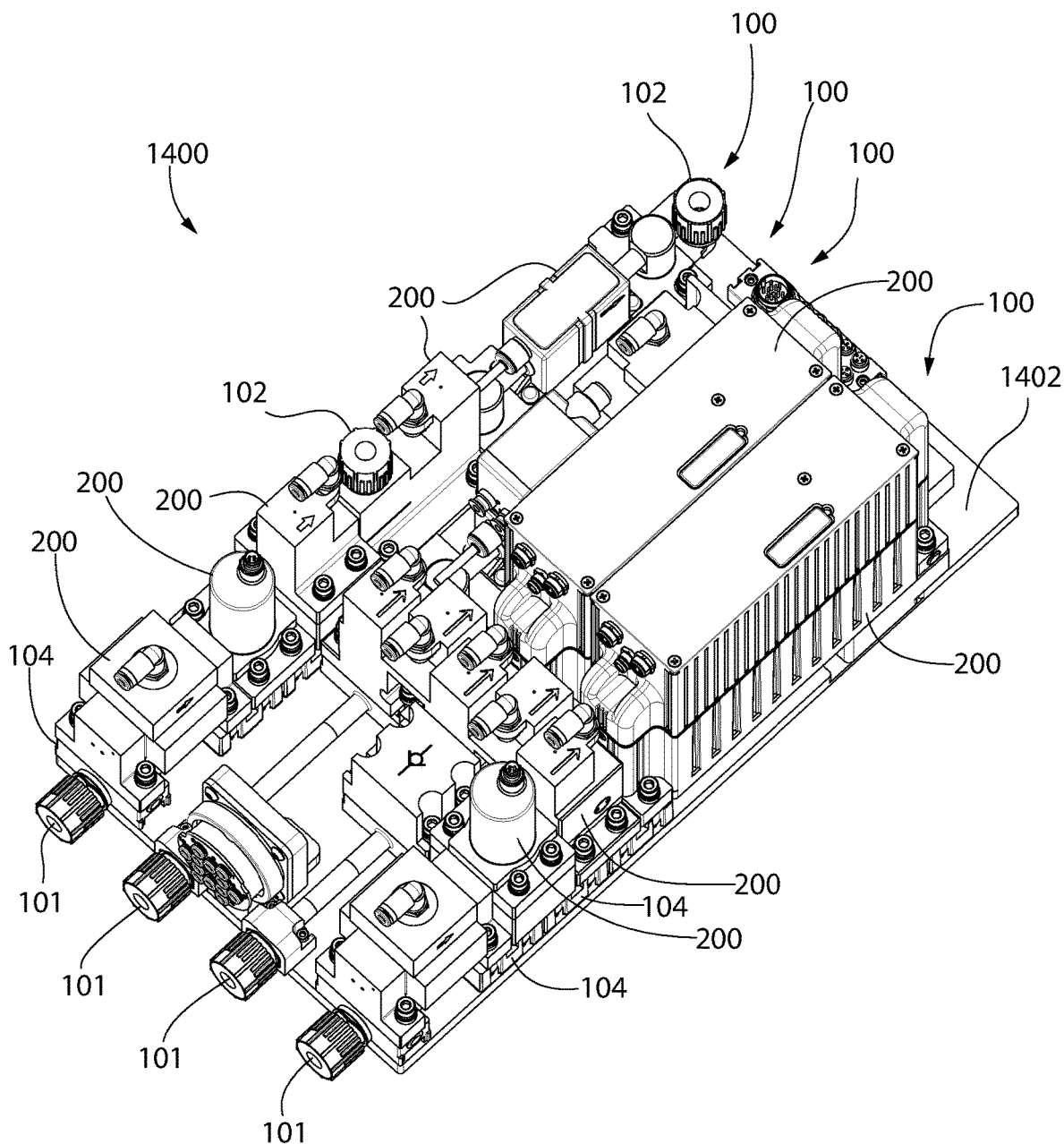
FIG. 2 is a perspective view of a fluid delivery module comprising a plurality apparatuses for controlling flow as may be utilized in the process of FIG. 1.
Figure 3:
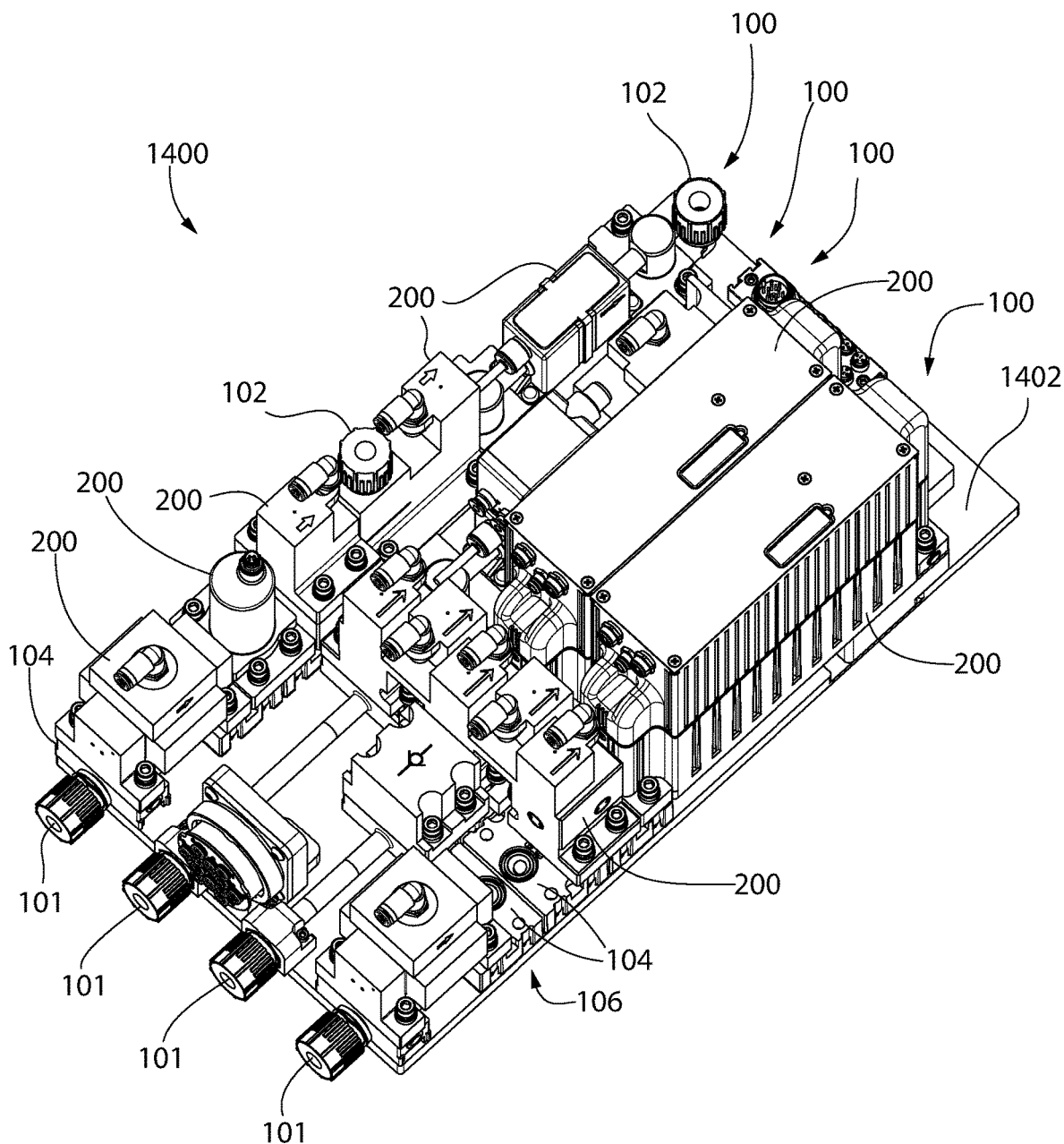
FIG. 3 is a perspective view of the module of FIG. 2 showing one fluid flow component removed.

FIGS. 2 and 3 show a schematic of an exemplary fluid delivery module 1400. In this embodiment, the fluid delivery module 1400 has a plurality of apparatus for controlling flow 100 having a plurality of inlets 101 and a plurality of outlets 102. In some embodiments, the plurality of inlets 101 do not correspond to the plurality of outlets 102 in a one to one manner. Instead, a plurality of inlets 101 may be joined into a single outlet 102 and a single inlet 101 may be split into a plurality of outlets 102. This may be done to achieve mixing or combination of different fluids prior to providing them to the process chamber 1300.

As can be seen, each of the apparatus for controlling flow 100 is arranged generally in a row, with the plurality of apparatus 100 in parallel rows. This need not be the case, and any packaging configuration may be used. The fluid delivery module 1400 has a substrate panel 1402. The substrate panel 1402 serves as structural support for the fluid delivery module 1400, but it may be simply used to facilitate assembly. Other structural support configurations are contemplated. A plurality of substrate blocks 104 rest on the substrate panel 1402 and comprise fluid ports therein to conduct flow to one or more fluid flow components 200 having corresponding fluid ports as discussed in greater detail below. The fluid flow components 200 may be considered active components while the substrate blocks 104 may be considered passive components. The fluid flow components 200 may be one or more of a valve, a flow controller, a pressure transducer, a flow measurement sensor, a pressure regulator, a flow restrictor, or an actuator, or any other known flow control component.

As can be seen by comparing FIG. 2 with FIG. 3, a fluid flow component 200 is removed from the fluid delivery module 1400 of FIG. 3. The removal of the fluid flow component 200 exposes portions of two substrate blocks 104. A component mounting location 106 is formed by the portions of the two substrate blocks 104. The component mounting location 106 may vary in size depending on the dimensions of the component 200 mounted to the component mounting location 106. Thus, different component mounting locations 106 may comprise different portions of the same substrate block 104. Each and every component 200 has a component mounting location 106 in the fluid delivery module 1400.

Turning to FIGS. 4A-D, a portion of the fluid delivery module 1400 is shown. Specifically, a fluid flow component 200 is shown mounted to a pair of substrate blocks 104 which form a component mounting location 106. The component 200 is mounted to the substrate blocks 104 via alignment features 250. The alignment features 250 may also be referred to as fasteners and may be utilized as both alignment features and fasteners. The alignment features 250 may be fasteners such as bolts, screws, pins, or other known fastening device. However, in other embodiments, the alignment features 250 may be separate from the fasteners. For instance, dowel pins or other pins may be used to align the fluid flow component 200 to the substrate blocks 104. Then, a separate fastener may be used for fastening the fluid flow component 200 to the substrate blocks 104. As can be seen in FIGS. 4A-D, the alignment features 250 extend through the substrate blocks 104.

Although not shown in FIGS. 4A-D, the substrate panel 1402 is threaded or has threaded inserts which receive the alignment features 250. Thus, the alignment features 250 extend through fastener passageways 208 in the fluid flow component 200, fastener passageways 108 in the substrate blocks 104, and install into threaded holes or other features in the substrate panel 1402. The alignment features 250 are intended for rough alignment, but precision alignment is provided by other geometry. Thus, the fastener passageways 108, 208 need not be a precision fit on the alignment features 250. In alternate embodiments, the alignment features 250 may install directly to the substrate blocks 104 via threaded holes or inserts within the fastener passageways 108. In these embodiments, the substrate blocks 104 may be separately attached to the substrate panel 1402 via additional fasteners. In other embodiments, the alignment features 250 may install into supports or other components which are beneath the substrate panel 1402.

Figure 4A:
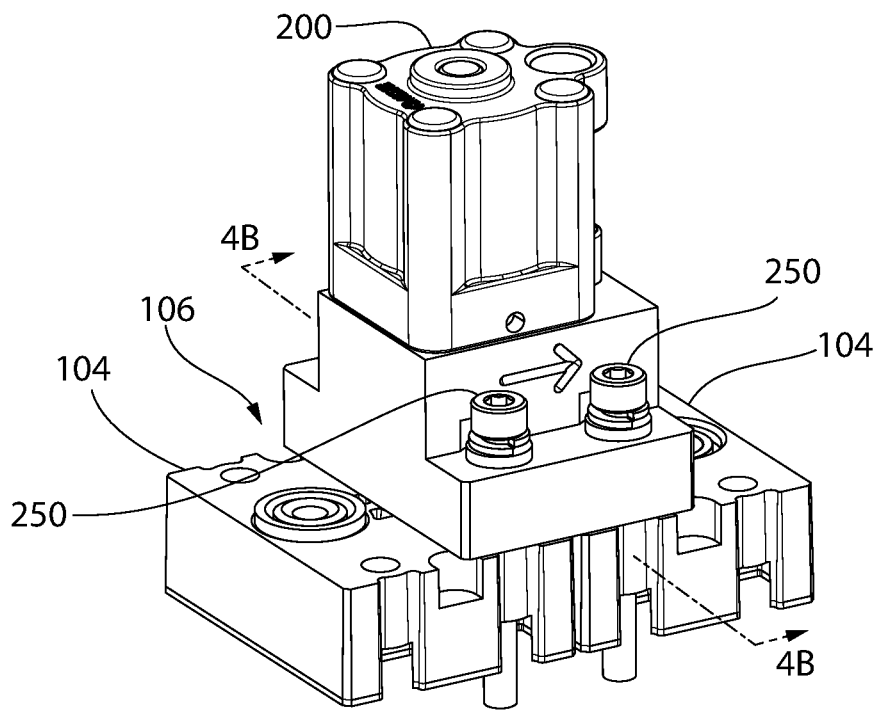
FIG. 4A is a perspective view of a component mounted to a pair of substrate blocks.
Figure 4B:
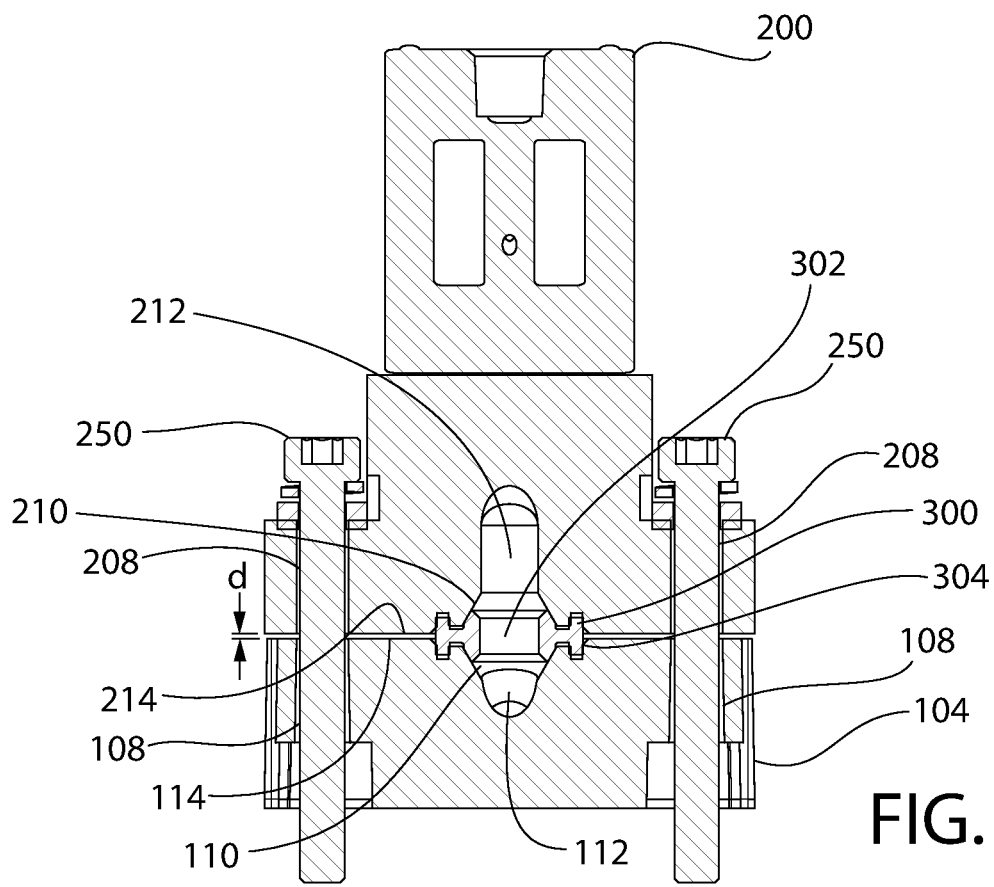
FIG. 4B is a cross-sectional view of the component and one of the substrate blocks of FIG. 4A, taken along line 4B-4B.

As best shown in FIG. 4B, a seal 300 is positioned between the fluid flow component 200 and the substrate block 104. The seal 300 is an annular seal having a cylindrical outer surface 304. The seal 300 also has a flow path 302 through the center which permits passage of fluid therethrough. The seal 300 provides a hermetic seal between a fluid port 210 of the fluid flow component 200 and a fluid port 110 of the substrate block 104. Each of the fluid ports 110 of the substrate block 104 comprises a seal cavity 116. Each of the fluid ports 210 of the fluid flow component 200 comprises a seal cavity 216. Each of the fluid ports 110 of the substrate blocks 104 comprises a seal cavity 116.

Figure 4C:
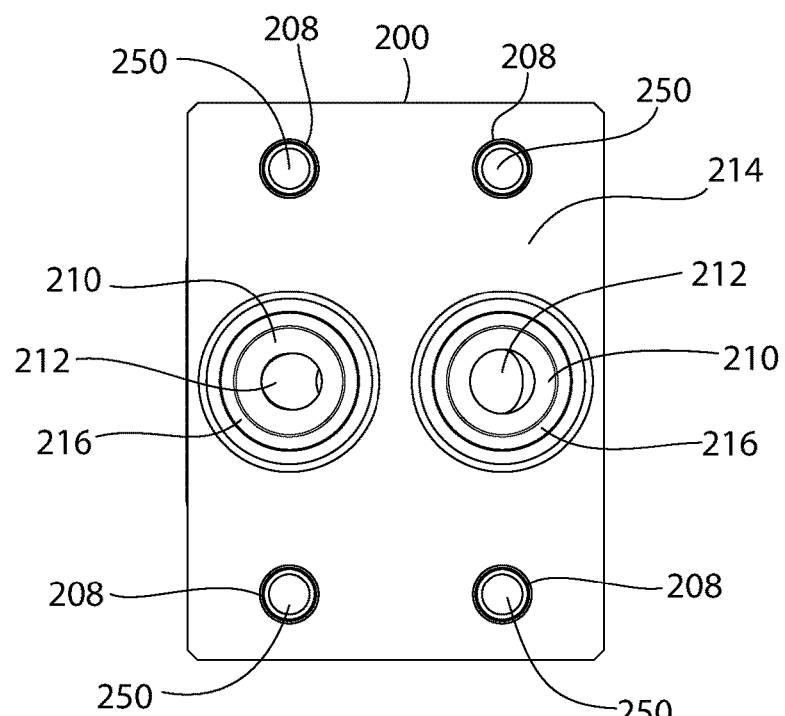
FIG. 4C is a bottom view of the component of FIG. 4A.
Figure 4D:
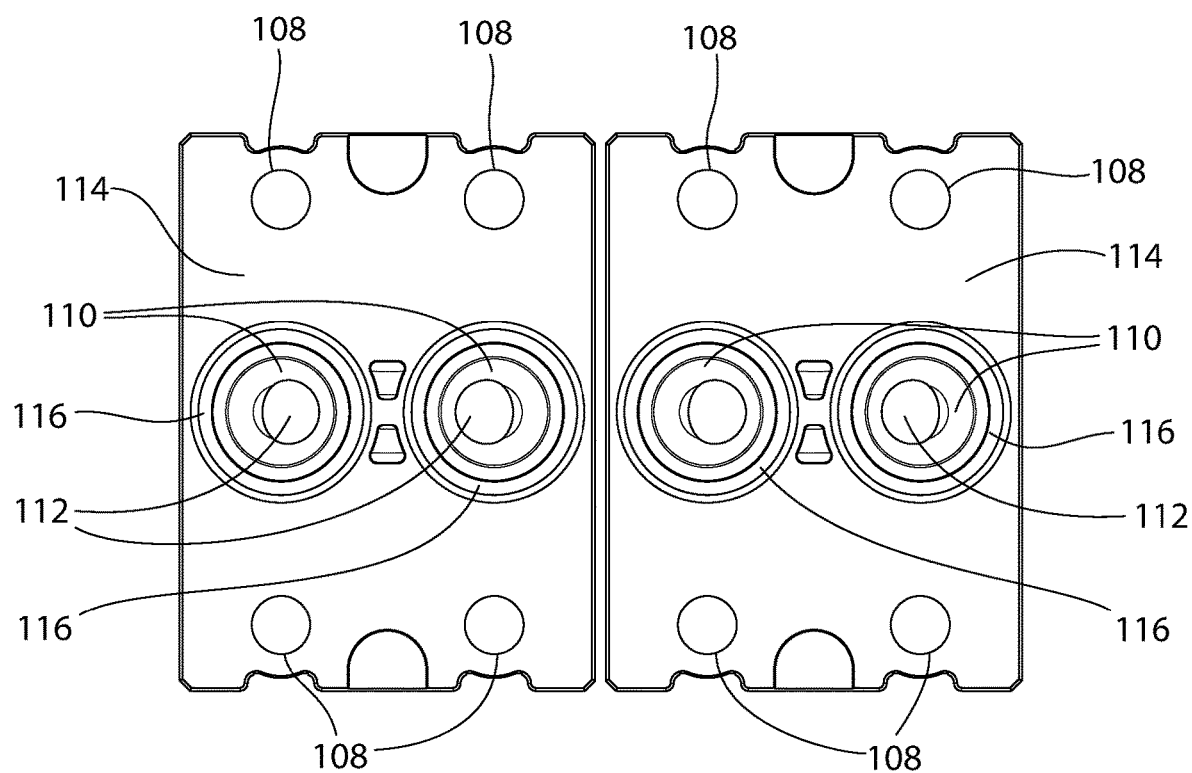
FIG. 4D is a top view of the substrate blocks of FIG. 4A.

As best shown in FIG. 4C, the fluid flow component 200 comprises a mounting surface 214 comprising two fluid ports 210, with one fluid port 210 being an inlet and the other being an outlet. A fluid flow path 212 extends from one fluid port 210 to the other fluid port 210. Similarly, in FIG. 4D, it can be seen that the substrate blocks 104 each comprise a mounting surface 114 comprising two fluid ports 110. A fluid flow path 112 extends from one fluid port 110 to the other fluid port 110. Returning to FIG. 4B, it can be seen that, when the seal 300 is installed between the fluid flow component 200 and the substrate block 104, there is a distance d between the mounting surfaces 214, 114. Thus, the seal 300 is compressed between the fluid flow component 200 and the substrate block 104. The seal 300 fits into the seal cavity 216 of the fluid flow component 200 and the seal cavity 116 of the substrate block 104. During assembly, the mounting surfaces 114, 214 are drawn closer together by the alignment features 250, reducing the distance d between the mounting surfaces 114, 214.

Figure 5:
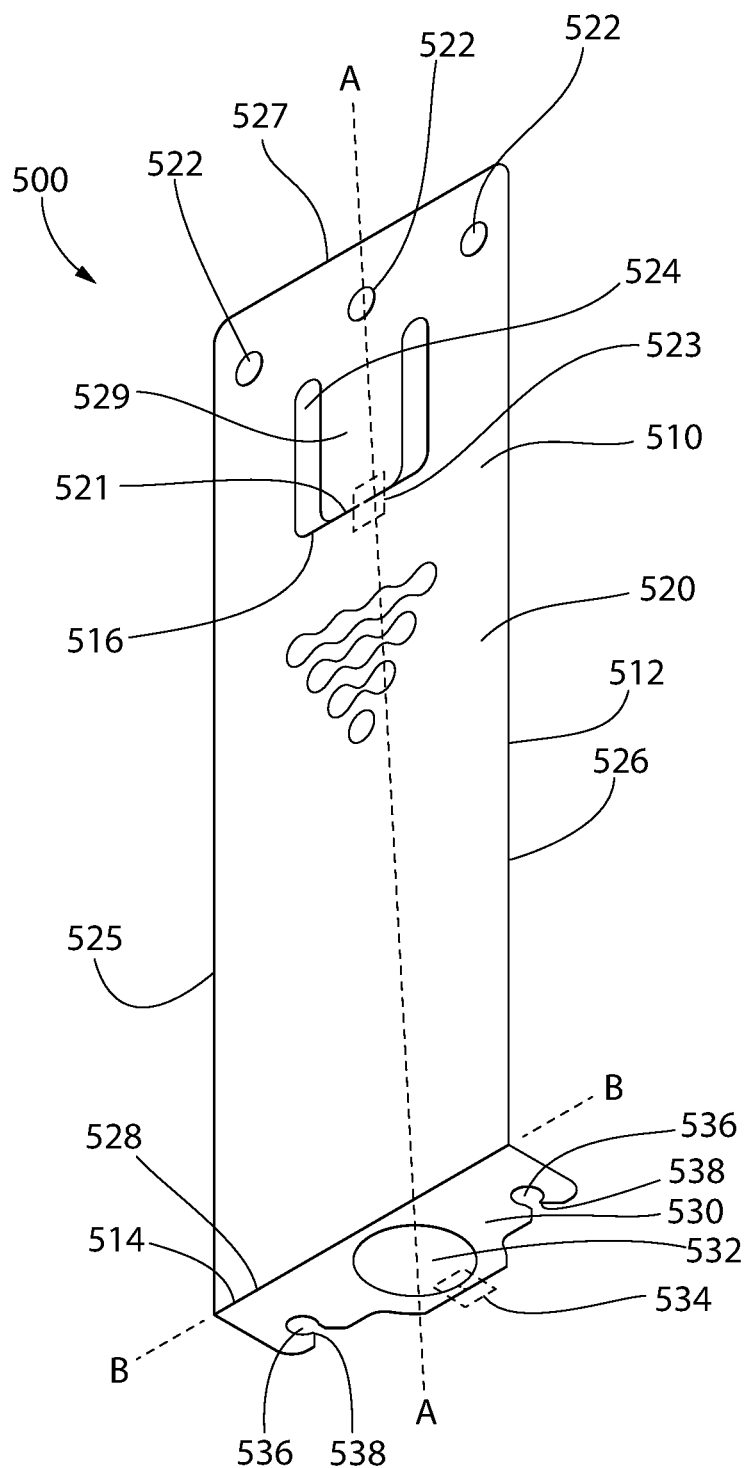
FIG. 5 is a perspective view of a seal retainer for installing a seal between a fluid flow component and a substrate block of an apparatus controlling flow.
Figure 6:
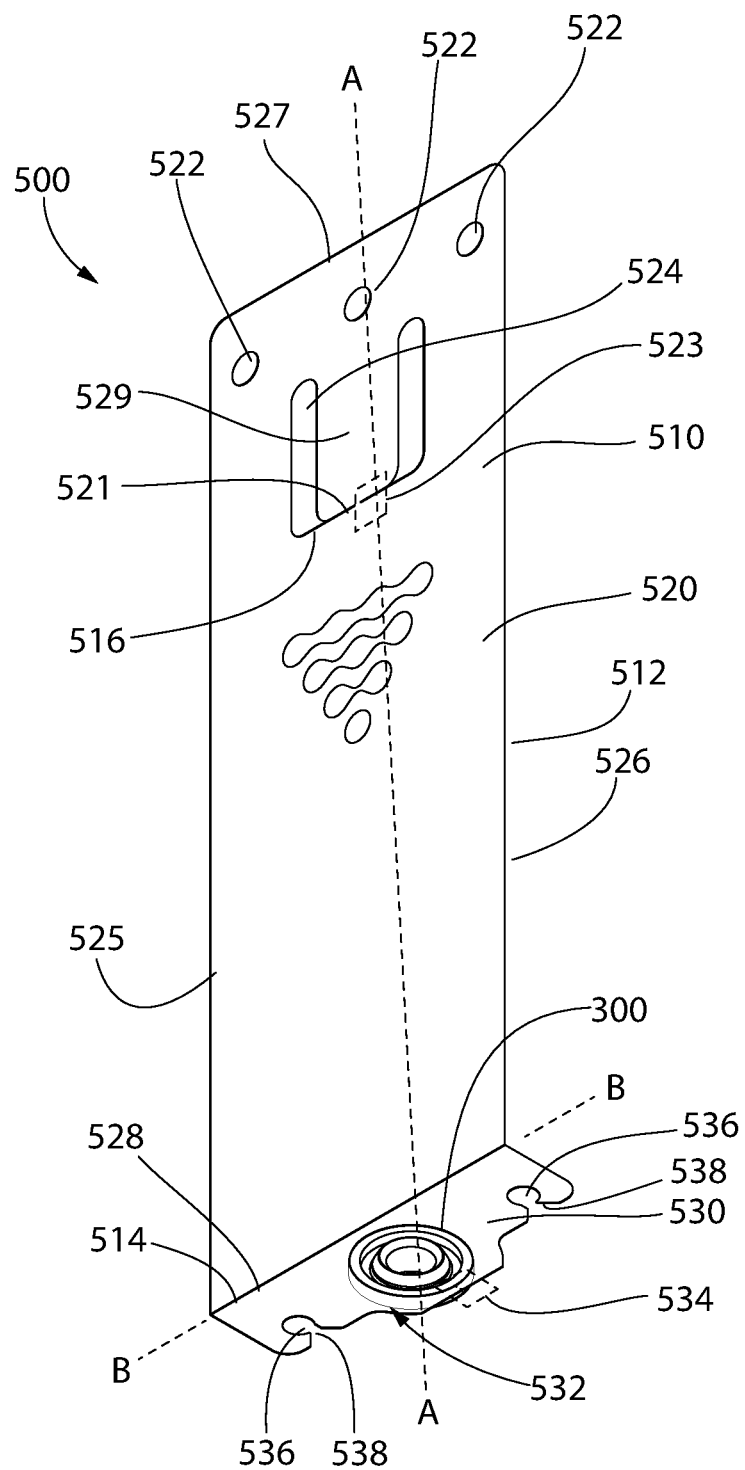
FIG. 6 is a perspective view of a seal assembly comprising the seal retainer of FIG. 5 and a seal installed in the seal retainer.
Figure 7:
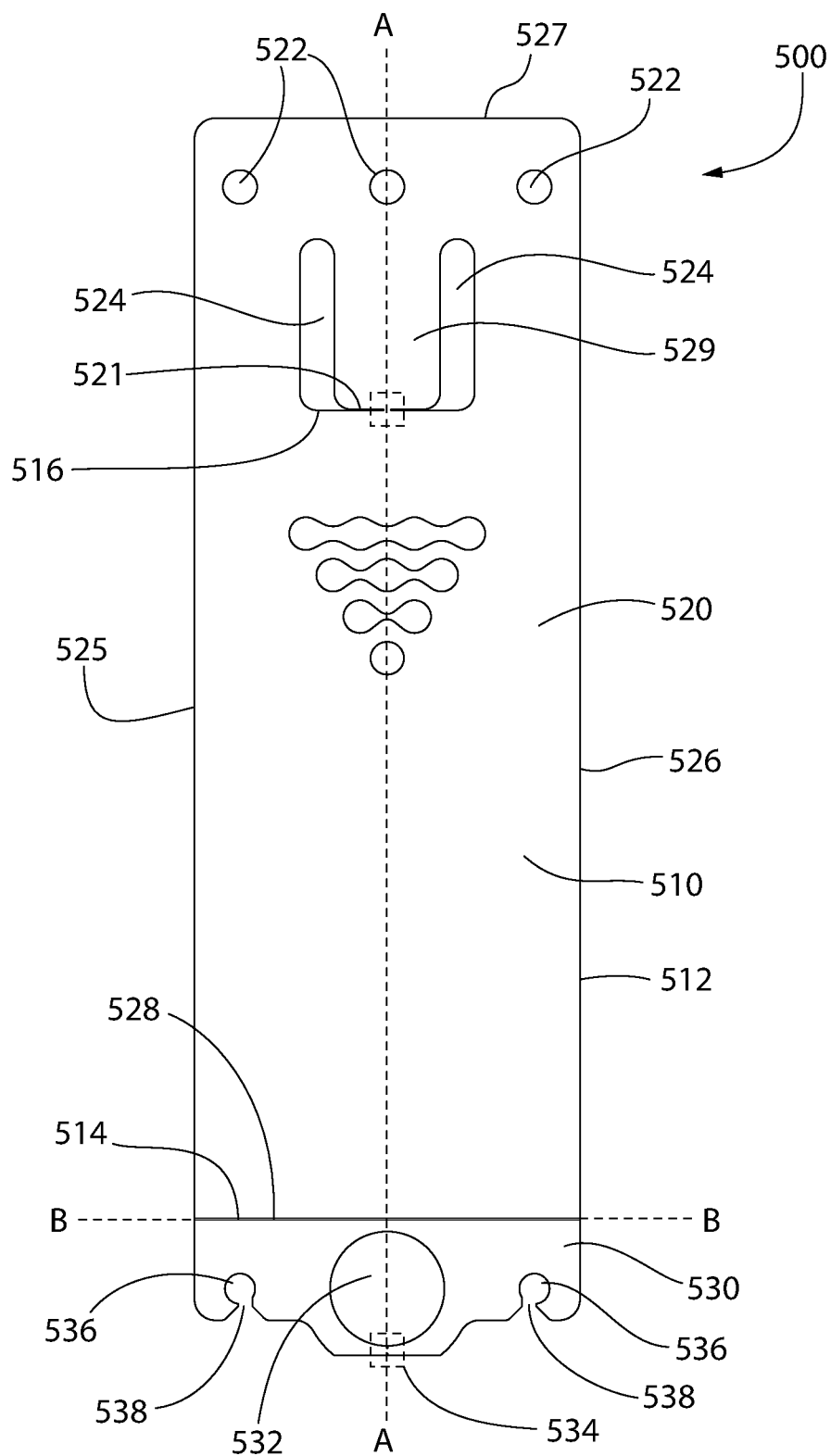
FIG. 7 is a plan view of the seal retainer of FIG. 5.

Turning to FIGS. 5-7, a seal retainer 500 is shown. The seal retainer is formed of a sheet body 510. The sheet body 510 may be formed of any sheet material, such as sheet metal, metal foil, plastic film, or the like. In particular, the sheet body 510 may be formed of one or more of polyethylene terephthalate, Mylar, perfluoroalkoxy alkane, polytetrafluoroethylene, polyether ether ketone, polyvinylidene fluoride, polyimide, polypropylene, or fluorinated ethylene propylene. The sheet body 510 may have a thickness of 0.013 mm, 0.010 mm, 0.016 mm, or any other thickness. As discussed in greater detail below, the material properties of the sheet body 510 and other aspects will dictate the optimal thickness. In all implementations, the sheet body 510 is flexible so that the seal retainer 500 can flex during use. The sheet body 510 will flex in order to receive the seal 300 and will flex in order to bend around the component 200.

The seal retainer 500 comprises a longitudinal axis A-A and a transverse axis B-B. In some embodiments, the longitudinal axis A-A and the transverse axis B-B are perpendicular, but in other embodiments they may be angled at angles other than 90 degrees. When the seal retainer 500 is in a flat state, the seal retainer 500 extends along the longitudinal axis A-A, the seal retainer 500 being elongate in the direction of the longitudinal axis. The seal retainer 500 has a length along the longitudinal axis A-A and a width along the transverse axis B-B, the width being less than the length. The seal retainer 500 further comprises a perimeter edge 512, the perimeter edge 512 extending around an outer edge of the sheet body 510.

The seal retainer 500 also comprises a first portion 520 and a second portion 530. The first portion 520 is formed by a first edge 525, a second edge 526 opposite the first edge 525, a third edge 527, and a fourth edge 528 opposite the third edge 527, the fourth edge 528 being collinear with the transverse axis B-B. The sheet body 510 comprises a fold line 514 which is also collinear with the transverse axis B-B. Thus, the fold line 514 is collinear with the fourth edge 528. The second portion 530 is defined by the fold line 514 and the remainder of the perimeter edge 512 of the sheet body 10. Thus, the second portion 530 is the portion that is on the opposite side of the transverse axis B-B from the first portion 520. The fold line 514 may be perforated, scored, grooved, or otherwise altered so that the sheet body 510 will fold cleanly about the transverse axis B-B. However, in other embodiments the fold line 514 may be formed without additional bending aids formed into the sheet body 510.

The first portion 520 also comprises a plurality of circular apertures 522 which form a gripping feature. The circular apertures 522 are arranged in a line so that a tool may be inserted into the circular apertures 522 and used as a handle for pulling on the first portion 520 of the seal retainer 500. Optionally, the circular apertures 522 are symmetrical about the longitudinal axis A-A. There may be fewer or more than three circular apertures.

A second gripping feature is formed by a pair of elongate apertures 524, the elongate apertures 524 being along the longitudinal axis A-A and symmetrical about the longitudinal axis A-A. The second gripping feature comprises a tab portion 529 having a distal edge 521. The sheet body 510 comprises an internal edge 516 which is joined to the distal edge 521 of the tab portion 529 by a frangible zone 523. The frangible zone 523 may be an area of the distal edge 521 that remains connected to the tab portion 529 in some manner. For instance, it may be scored, grooved, cut, or perforated. In other words, the distal edge 521 is connected to the internal edge 516 but the connection is weakened intentionally to permit breakage of the frangible zone 523. The frangible zone 523 may also be known as a pre-weakened zone or pre-weakened area. The tab portion 529 may then be folded upward away from the first portion 520 so that the user can insert a finger into the first portion 520 between the elongate apertures 524. This can be used to pull on the first portion 520. Reasons for the importance of gripping features will be discussed in greater detail below.

The second portion 530 can be transitioned from the flat state discussed above to a folded state. In the flat state, the first portion 520 forms a first planar surface and the second portion 530 forms a second planar surface. Each of the first and second planar surfaces are coplanar. In other words, they both occupy the same plane and form a single planar surface. In the flat state, the first portion 520 is coincident with the longitudinal axis A-A. In the flat state, the second portion 530 is also coincident with the longitudinal axis. In the folded state, the second portion 530 is bent about the transverse axis B-B along the fold line 514. Thus, the second portion 530 and (its corresponding second planar surface) are no longer coplanar with the first planar surface of the first portion 520. The second portion 530 may be angled at any angle, but is most preferably angled at approximately 90 degrees to the first portion 520. Thus, the second portion 530 is angled with respect to the longitudinal axis A-A. The second portion 530 rotates about the transverse axis B-B at the fold line 514.

The second portion 530 comprises a seal aperture 532 configured to accept a seal 300. As shown in FIG. 6, the seal 300 fits within the seal aperture 532 so that the seal 300 is retained by the seal aperture 532. A seal assembly 540 is formed by the assembly of a seal 300 with a seal retainer 500, the seal 300 being assembled into the seal aperture 532. As shown, the seal aperture 532 is circular and engages the cylindrical outer surface 304 of the seal 300. The seal aperture 532 is preferably sized so that it is an interference fit with the cylindrical outer surface 304 to prevent movement of the seal 300 in the seal aperture 532. However, other geometries are contemplated for the seal aperture 532.

Adjacent the seal aperture 532, a frangible zone 534 is positioned between the seal aperture 532 and the perimeter edge 512 of the sheet body 510. As discussed above with respect to the frangible zone 523, the frangible zone 534 may be slotted, perforated, grooved, scored, or otherwise weakened to promote breakage of the sheet body 510 at the frangible zone 534. The frangible zone 534 may also be known as a pre-weakened zone or pre-weakened area. The frangible zone 534 will be discussed in greater detail below.

The second portion 530 further comprises a pair of fastener engagement features 536. The fastener engagement features 536 are semi-circular in construction with an entry slot 538 that has a width less than the diameter of the semi-circular fastener engagement feature 536. In alternate configurations, the entry slot 538 may be replaced by a frangible zone or other feature. The fastener engagement features 536 need not be semi-circular, and may have different shapes, as desired. The fastener engagement features 536 are configured to engage the alignment features 250 and may be the same diameter or general dimensions as the alignment features 250. Alternately, they may be an interference fit or they may have some clearance between the fastener engagement features 536 and the alignment features 250.

Figure 8A:
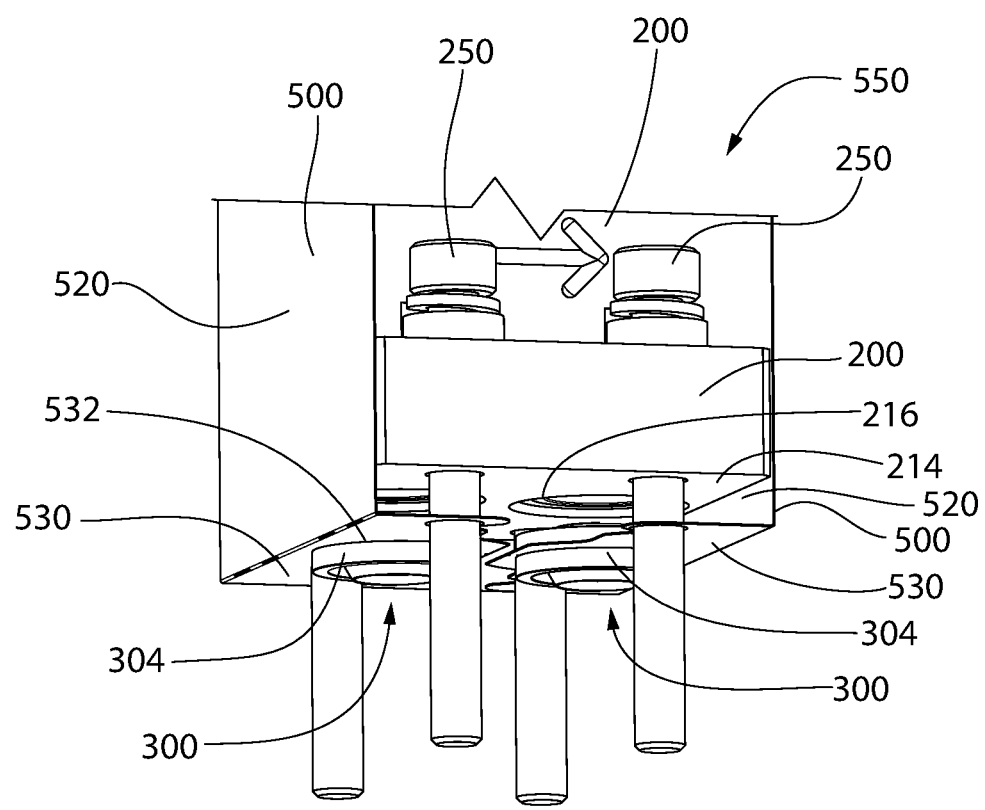
FIG. 8A is a lower perspective view of a portion of a component assembly including two seal retainers, two seals, and a flow control component.
Figure 8B:
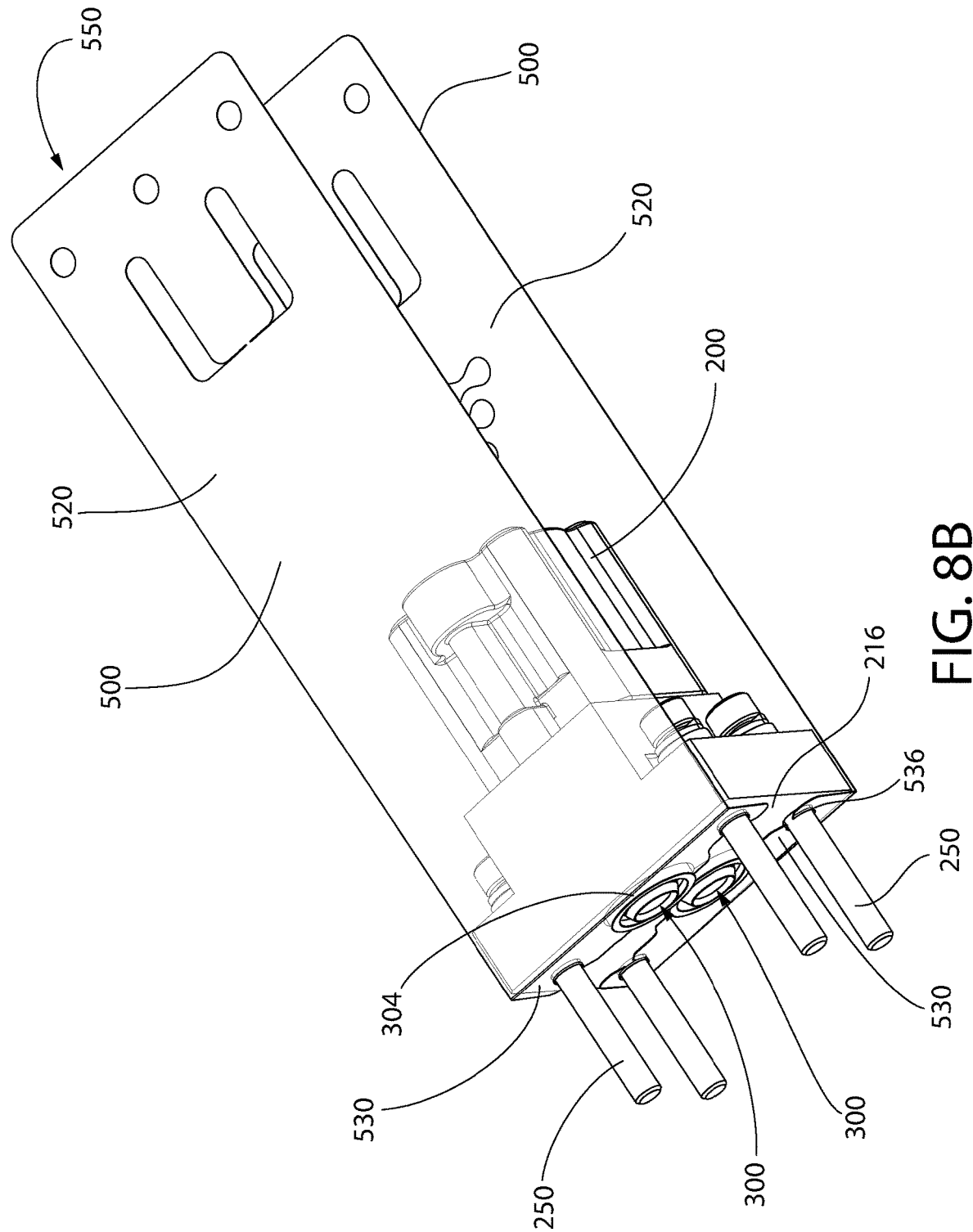
FIG. 8B is a perspective view of the component assembly of FIG. 8A.

Turning to FIGS. 8A and 8B, a component assembly 550 is shown. The component assembly 550 comprises the fluid flow component 200, a plurality of alignment features 250, and two seal assemblies 540. In FIG. 8A, the seal assemblies 540 are not yet fully assembled to the fluid flow component 200. As can be seen, the seal cavities 216 of the component 200 are still exposed, with the seals 300 spaced from the seal cavities 216. The fastener engagement features 536 are engaged with the alignment features 250 so that the first portions 520 of the seal retainer are located on opposite sides of the fluid flow component 200. In FIG. 8B, the seal assemblies 540 are fully assembled to the fluid flow component 200 such that the seals 300 are at least partially inserted into the seal cavities 216. The fastener engagement features 536 remain engaged with the alignment features 250 to facilitate the retention of the seals 300 in contact with the seal cavities 216.

Figure 9A:
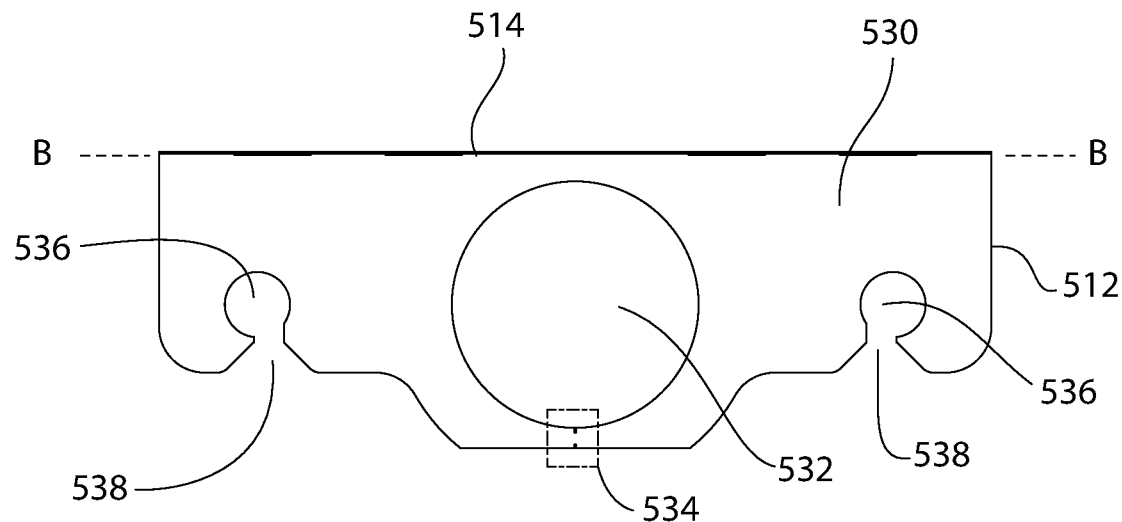
FIG. 9A is a plan view of a portion of the seal retainer of FIG. 5.
Figure 9B:
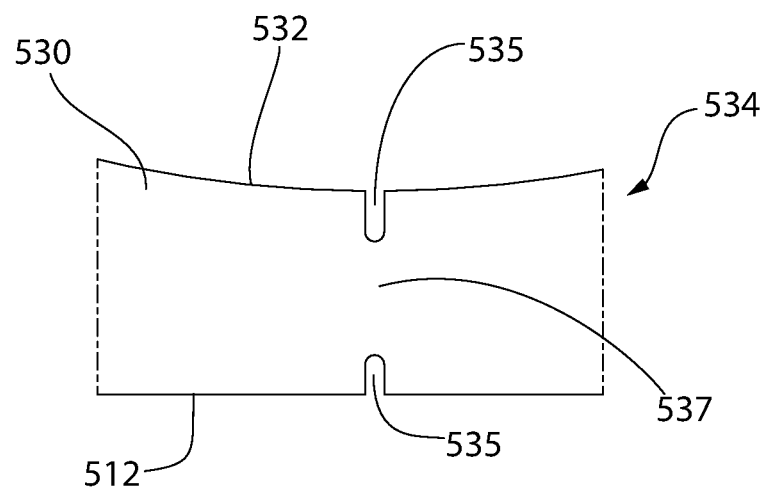
FIG. 9B is a detail view of the portion of the seal retainer of FIG. 9A showing a frangible zone.

FIGS. 9A and 9B show detailed views of a portion of the seal retainer 500. In particular, the second portion 530 is shown in detail in FIG. 9A. As can be seen, the frangible zone 534 is adjacent the seal aperture 532. The frangible zone 534 is shown in greater detail in FIG. 9B. As is apparent, the seal aperture 532 is located on one side of the frangible zone 534. The perimeter edge 512 of the sheet body 510 is located on an opposite side of the frangible zone 534. The frangible zone 534 comprises a pair of slots 535 and an unbroken section 537. A first one of the slots 535 extends from an edge of the seal aperture 532, while a second one of the slots 535 extends from the perimeter edge 512 of the sheet body 510. An unbroken section 537 is located between the slots 535.

Figure 9C:
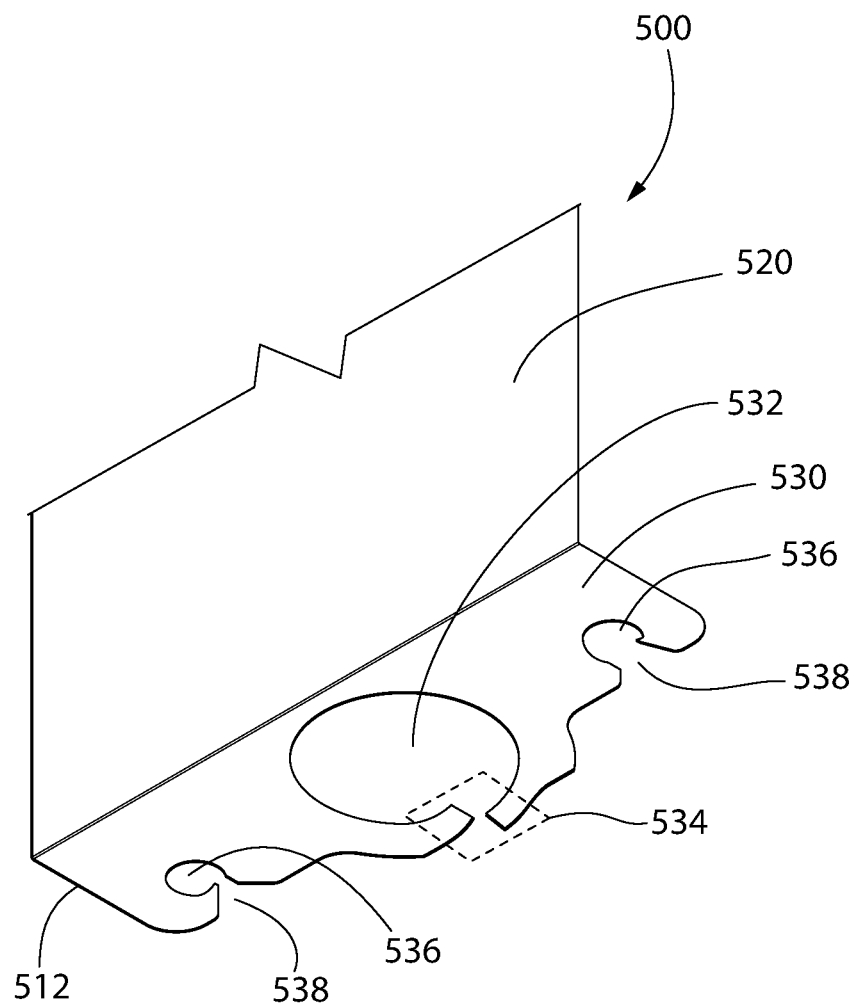
FIG. 9C is a perspective view of a portion of the seal retainer of FIG. 5 after removal of the seal retainer from the fluid flow component.

Thus, the frangible zone 534 is configured to tear the unbroken section 537 by increasing stress concentrations adjacent the slots 535 and ensuring a clean and easy break when the user pulls on the first portion 520 of the seal retainer 500. A representation of a broken seal retainer is shown in FIG. 9C. As mentioned above, grooves, slots, perforations, holes, or any other known means may be used to selectively weaken the frangible zone 534. Combinations of multiple techniques may also be used to promote breaking within a desired area in the frangible zone. The design of the features in the frangible zone 534 may also be used to control breaking force. This, in combination with parameters such as material and thickness of the sheet body 510 will allow close control of the required force.

Figure 10:
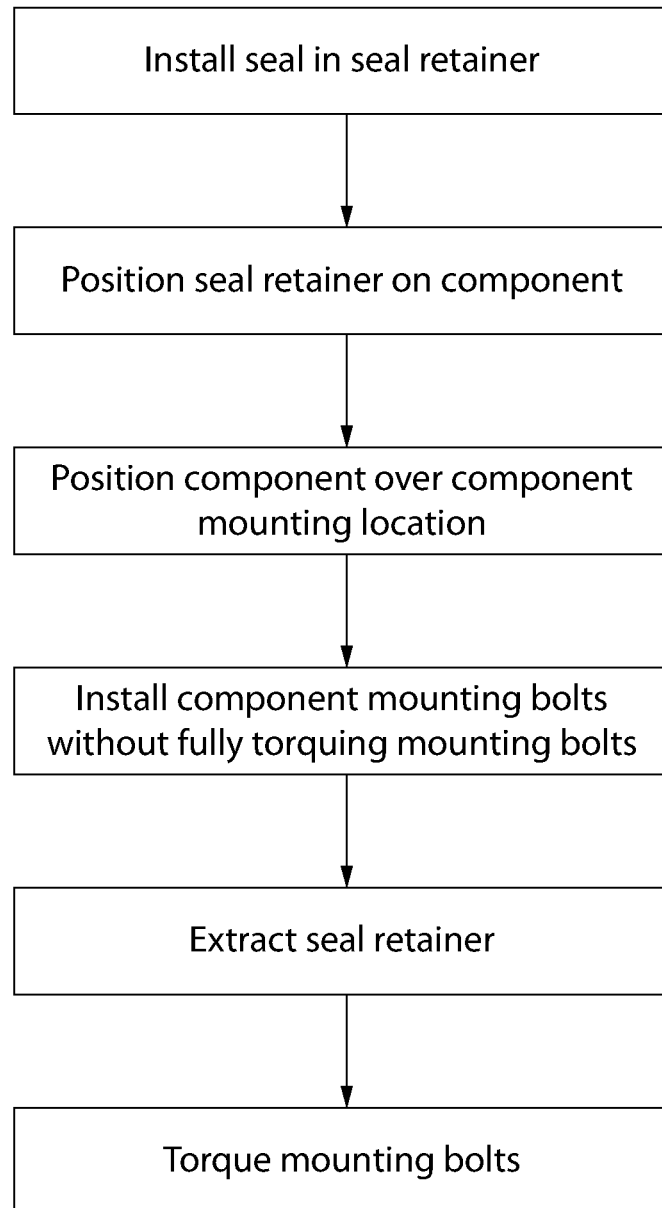
FIG. 10 is a flow chart showing the method of installing the fluid flow component in an apparatus for controlling flow.

FIG. 10 shows a flow chart illustrating the steps for installing a fluid flow component 200 into an apparatus for controlling flow 100. First, the user positions a seal 300 into a seal retainer 500. Specifically, the seal 300 is inserted into the seal aperture 532 so that the seal aperture 532 is located approximately at a midpoint on the cylindrical outer surface 304. This assembly step forms a seal assembly 540. The seal retainer 500 may be folded along the fold line 514 before or after insertion of the seal 300 into the seal aperture 532, but is preferably folded prior to insertion of the seal 300.

Second, the seal assembly 540 is positioned on the fluid flow component 200. The seal assembly 540 is positioned such that the seal 300 engages a seal cavity 216 of the fluid flow component 200. The seal retainer 500 is positioned so that alignment features 250 of the fluid flow component 200 engage fastener engagement features 536 of the second portion 530 of the seal retainer 500. The alignment features 250 are inserted into the fastener passageways 208 of the fluid flow component 200 prior to assembling the seal assembly to the fluid flow component 200. The first portion 520 of the seal retainer 500 extends along a side of the fluid flow component 200 while the second portion 530 is positioned approximately parallel to the mounting surface 216 of the fluid flow component 200. A component assembly 550 is formed by the combination of the seal assembly 540, the fluid flow component 200, and the alignment features 250. Optionally, the alignment features 250 may be considered part of the fluid flow component 200 or may be considered separate components which form a part of the component assembly 550. Nonetheless, a completed component assembly 550 comprises at least one alignment feature 250.

Third, the fluid flow component 200 is positioned atop the component mounting location 106. Thus, the fluid flow component 200 overlays at least one substrate block 104. The seal 300 is positioned so that it is in contact with a seal cavity 116 of the substrate block 104. Thus, the seal 300 is aligned with the seal cavity 116 of the substrate block 104 and the seal cavity 216 of the fluid flow component 200. In positioning the fluid flow component 200 atop the component mounting location 106, the alignment features 250 are inserted into the fastener passageways 108. In this embodiment, the alignment features 250 are bolts, and the bolts facilitate alignment of the fluid flow component 200 and the substrate block 104 while retaining the seal retainer 500. This ensures that the seal 300 remains in contact with the seal cavity 216 during positioning of the fluid flow component 200. However, the seal 300 is not necessarily fully inserted into the seal cavity 216 or the seal cavity 116 during this or previous steps. Additional fastening is required to properly seat the seal 300 and ensure a hermetic seal of the fluid flow paths 112, 212, 302.

Fourth, in the present embodiment, the alignment features 250, which are bolts, are partially installed. Thus, the alignment features also serve as fasteners which compress the seal 300. The alignment features 250 may be installed finger tight, or otherwise to a torque that is less than a specified maximum torque. Partial fastening is essential to avoid pinching the seal retainer 500 between the fluid flow component 200 and the substrate block 104.

Fifth, the seal retainer 500 is retracted. The user utilizes a gripping feature such as the circular apertures 522, the elongate apertures 524 and the tab portion 529, or even the first portion 520 itself. The user applies a retraction force on the first portion 520 in order to break the frangible zone 534 adjacent the seal aperture 532. The seal retainer 500 may then be removed, such that no part of the seal retainer 500 remains between the fluid flow component 200 and the substrate block 100 after the seal retainer 500 is retracted.

Sixth, the alignment features 250, in this case bolts, are torqued to a torque specification. If alternate (non-threaded) fastening means are used, then the fasteners of this alternate fastening means would be installed such that they provide the intended clamping force between the substrate block 104 and the fluid flow component 200. Thus, the seal 300 is fully seated in the respective seal cavities 116, 216 and a hermetic seal is formed between the fluid flow paths 112, 212, 302. Optionally, this process may be performed in parallel such that two or more seal assemblies 540 are formed and installed on the fluid flow component 200. For instance, where a fluid flow component 200 has two fluid ports 210, the process would be performed twice in parallel. Where a fluid flow component 200 has three fluid ports 210, the process would be performed three or more times in parallel. In order to complete a flow path from a fluid supply to the processing chamber 1300, each and every fluid port 210 must either be hermetically sealed to a fluid port 110 of a substrate block 104 or to a conduit which connects to a component or external device.

Figure 11A:
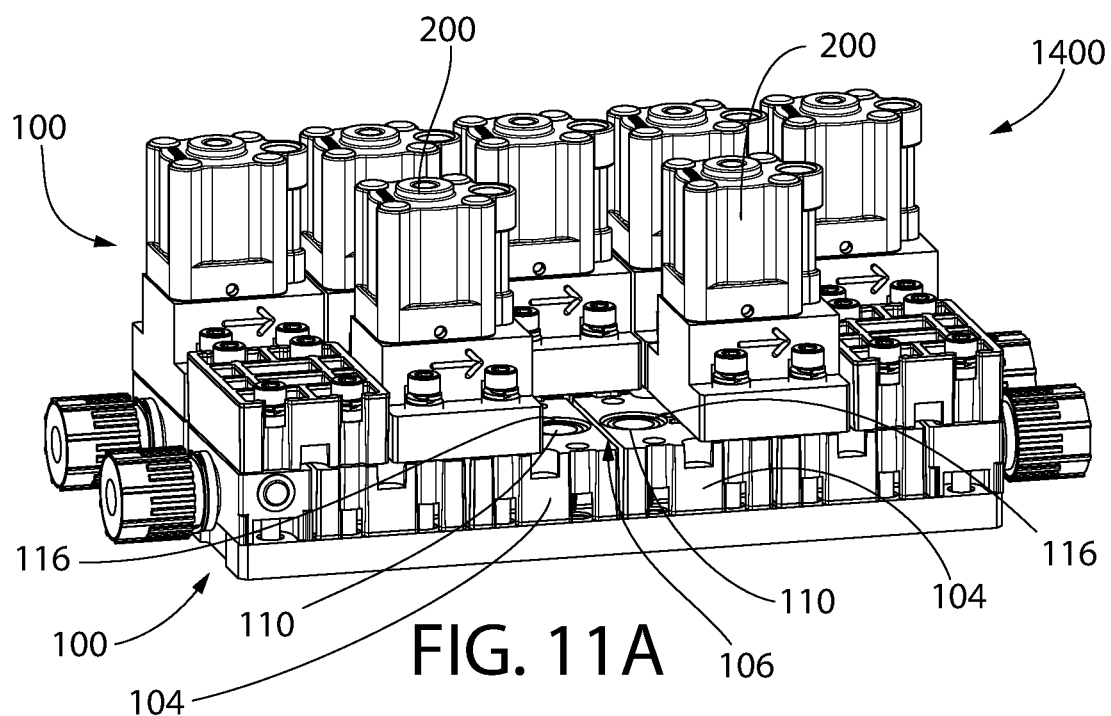
FIG. 11A is a perspective view of a fluid delivery module showing an apparatus for controlling flow having a missing fluid flow component.

Turning to FIGS. 11A-E, the assembly method is shown in greater detail. Another embodiment of a delivery module 1400 is shown with two apparatus for controlling flow 100 arranged in parallel. In FIG. 11A, one of the apparatus for controlling flow 100 is incomplete, with a component mounting location 106 missing a fluid flow component. As can be seen, two substrate blocks 104 of the component mounting location 106 have exposed fluid ports 110 and the seal cavities 116 are free of seals 300. Thus, the component mounting location 106 is prepared for installation of a fluid flow component 200.

Figure 11B:
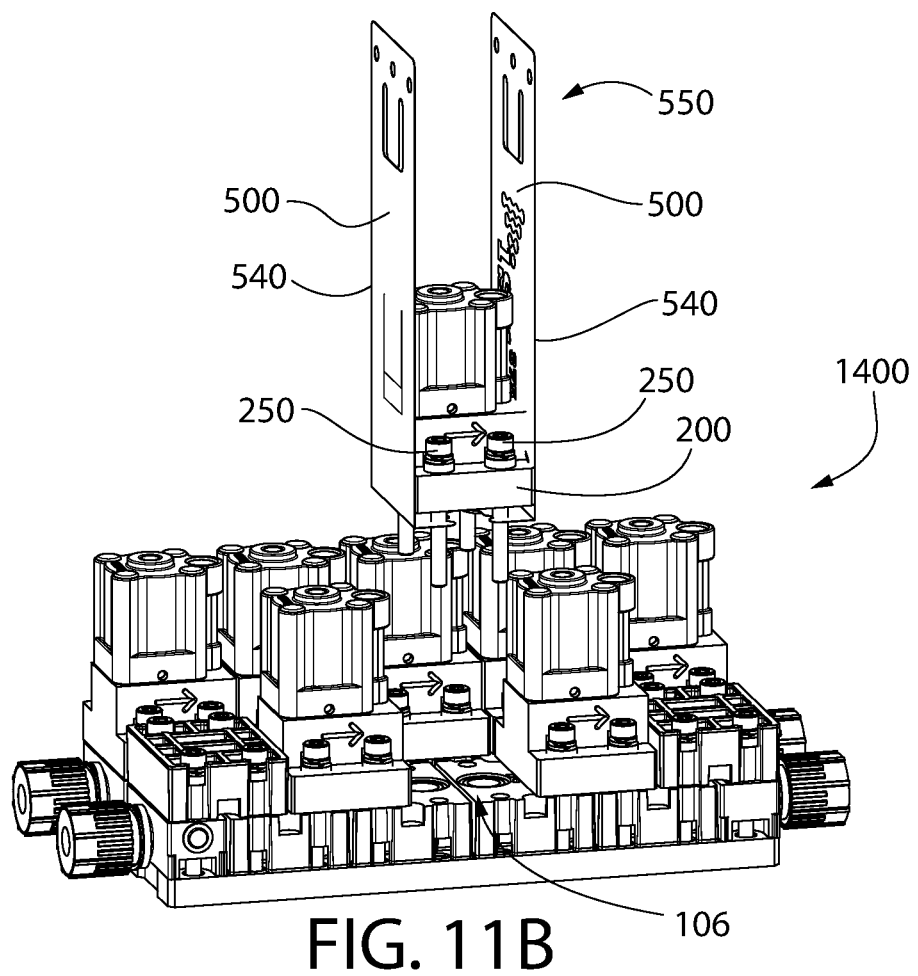
FIG. 11B is a perspective view of the fluid delivery module of FIG. 11A showing a component assembly in preparation for assembly.
Figure 11C:
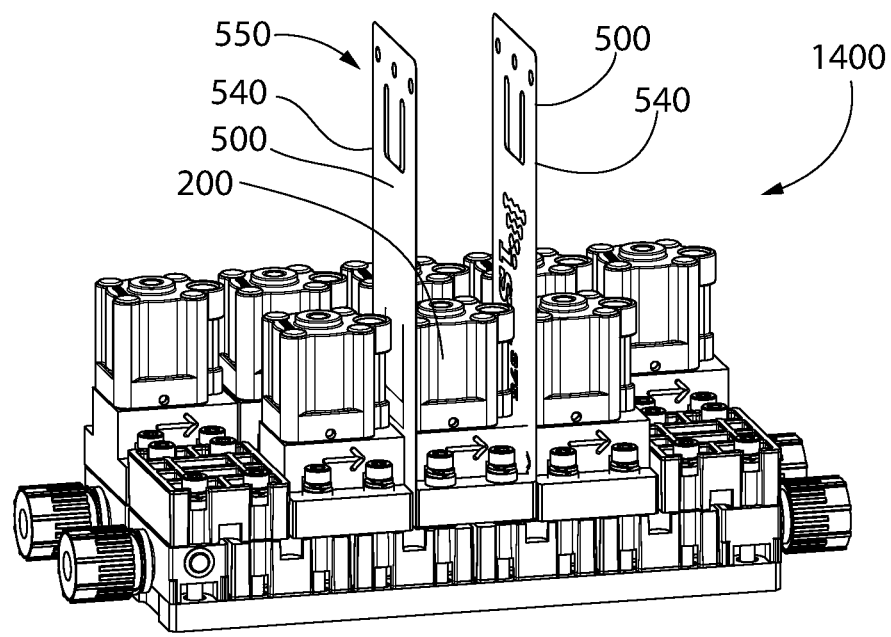
FIG. 11C is a perspective view of the fluid delivery module of FIG. 11A showing the component assembly partially fastened to the apparatus for controlling flow.
Figure 11D:
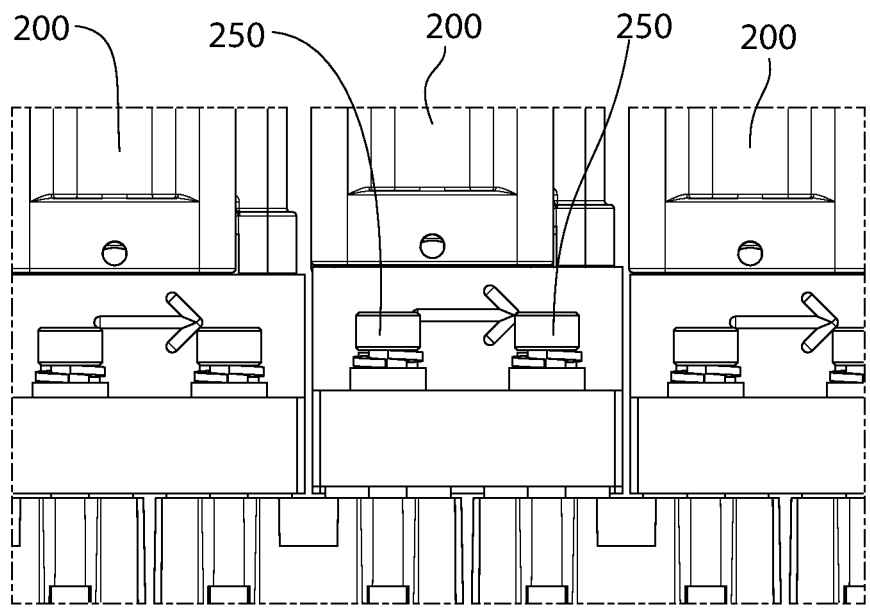
FIG. 11D is a detail view a portion of the apparatus for controlling flow of FIG. 11A showing the fluid flow component of the component assembly with the seal retainers removed.
Figure 11E:
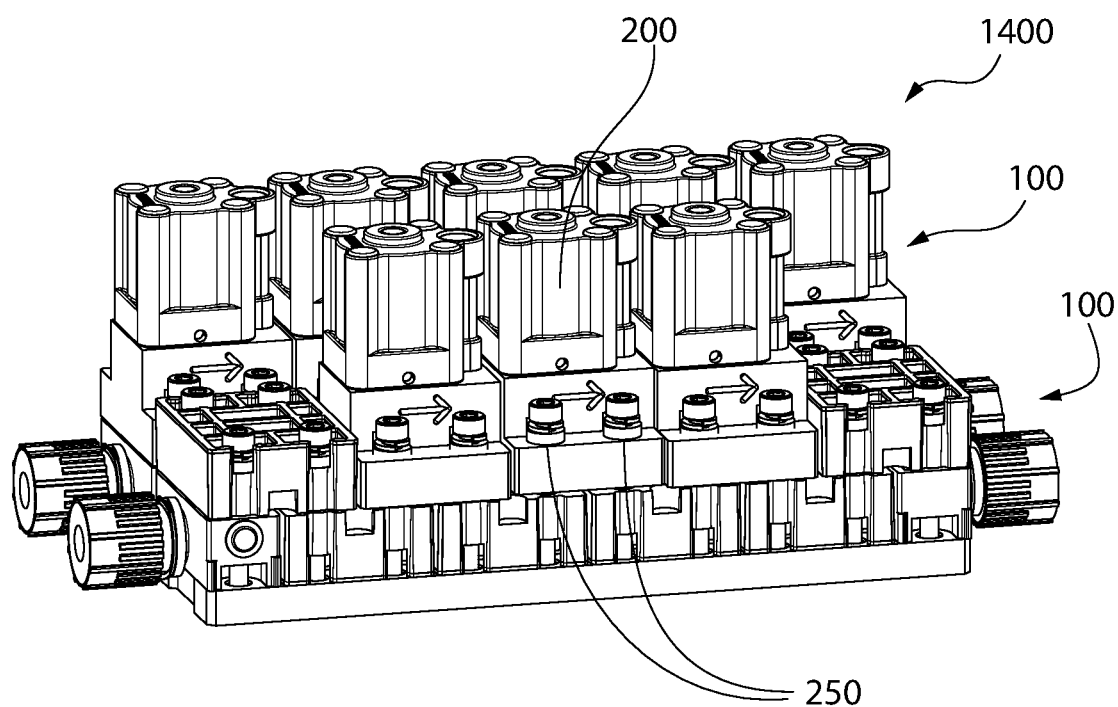
FIG. 11E is a perspective view of the fluid delivery module of FIG. 11A showing the fluid flow component completely fastened to the apparatus for controlling flow.

In FIG. 11B, a component assembly 550 is shown positioned above the component mounting location 106. As discussed above, the component assembly 550 comprises two seal assemblies 540, a plurality of alignment features 250, and a fluid flow component 200. In FIG. 11C, the component assembly 550 is positioned atop the component mounting location 106 so that the seal cavities 116, 216 are aligned with the seals 300. The alignment features 250 are partially fastened. Turning to FIG. 11D, a detail view of the component assembly 550 is shown, with the seal retainers 500 retracted. As can be seen, the fluid flow component 200 is slightly higher than the fluid flow components 200 on either side because the fluid flow component 200 has not yet been completely fastened. Finally, in FIG. 11E, the fluid flow component 200 is completely fastened via the alignment features 250. The seal 300 is fully compressed and a hermetic seal is provided that ensures leakage free operation of the apparatus for controlling flow 100.

Figure 12:
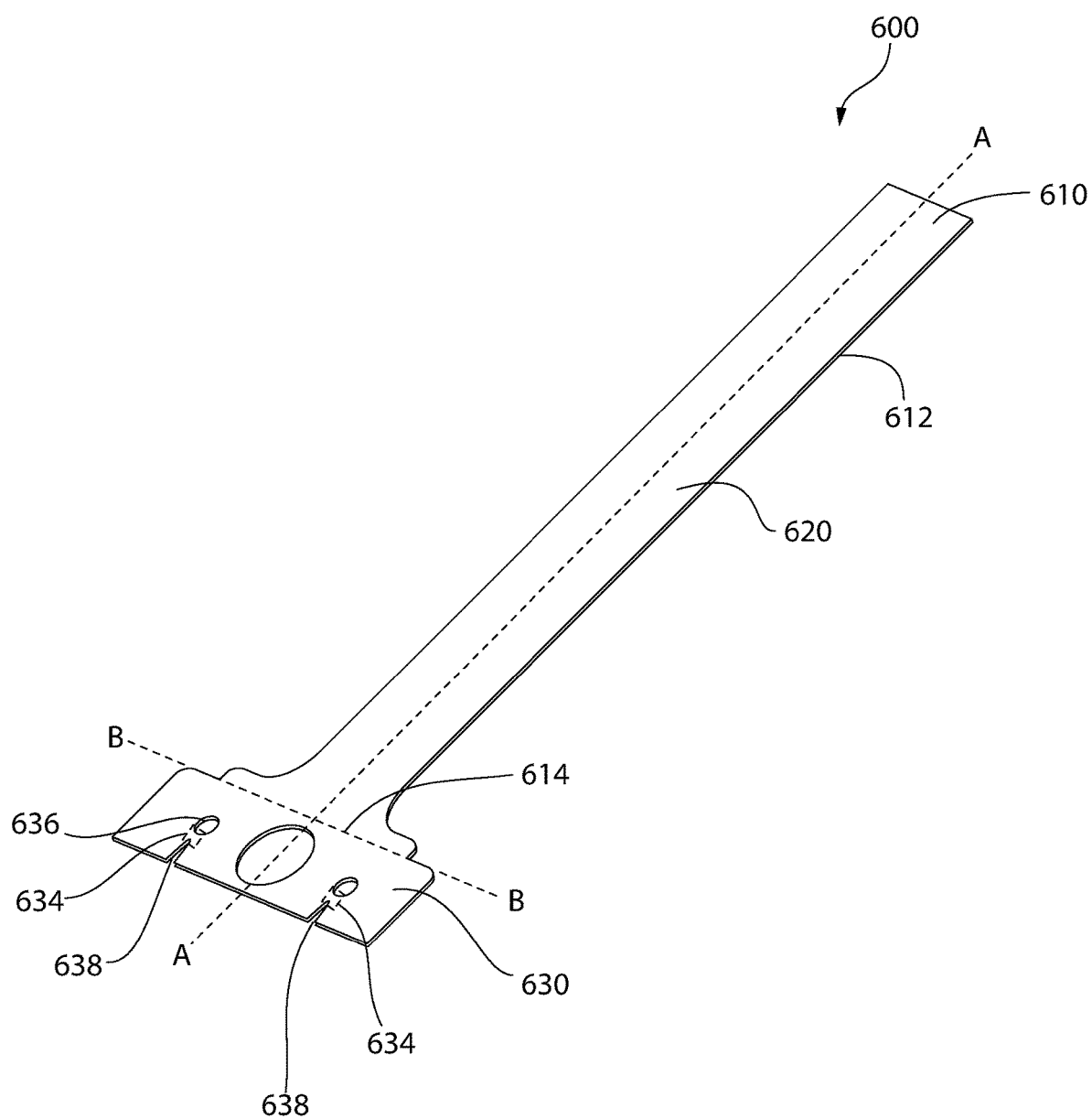
FIG. 12 is a perspective view illustrating an alternate embodiment of the seal retainer.

Turning to FIG. 12, an alternate seal retainer 600 is shown. The seal retainer 600 has a sheet body 610 having a perimeter edge 612. A longitudinal axis A-A extends along the length of the seal retainer 600, while a transverse axis B-B extends along a fold line 614. A first portion 620 is long enough that the user can grip the first portion to enable retracting the seal retainer 600 after assembly of a component assembly 550. A second portion 630 has a seal aperture 632. However, no frangible zone is located between the perimeter edge 612 and the seal aperture 632. Instead, the fastener engagement features 636 have frangible zones 634 formed therebetween. The frangible zones 634 are selectively weakened by providing entry slots 638 which have a sharp edge. However, there is no weakening feature extending from the fastener engagement features 636. The functioning of the seal retainer 600 is substantially identical to the seal retainer 500, with the exception of increased retention of the alignment features 250 provided by the different configuration of the fastener engagement features 636.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A method of installing a fluid flow component in an apparatus for controlling flow, the method comprising:
    a) positioning a first seal into a first seal retainer to form a seal assembly;
    b) installing the seal assembly onto the fluid flow component so that the first seal is aligned with a first seal cavity of the fluid flow component, thereby forming a component assembly;
    c) positioning the component assembly atop a first substrate block of the apparatus for controlling flow so that the first seal is aligned with a first seal cavity of the first substrate block and a portion of the first seal retainer is positioned between the first substrate block and the fluid flow component;
    d) partially fastening the component assembly to the apparatus for controlling flow so that the first seal is at least partially disposed within each of the first seal cavity of the first substrate block and the first seal cavity of the fluid flow component;
    e) retracting the first seal retainer so that the first seal retainer is released from the fluid flow component and the portion of the first seal retainer is removed from between the first substrate block and the fluid flow component; and
    f) completely fastening the component assembly to the apparatus for controlling flow.

2. The method of claim 1 wherein apparatus for controlling flow further comprises a base substrate and the fluid flow component assembly further comprises a first fastener, and in step c), the first substrate block is in contact with the base substrate.

3. The method of claim 1 wherein the apparatus for controlling flow comprises a first component mounting location, the first component mounting location comprising the first substrate block and a second substrate block, wherein the second substrate block comprises a first seal cavity, the fluid flow component comprises a second seal cavity and a second fastener, further comprising steps a-1) and b-1), wherein step a-1) comprises installing a second seal into a second seal retainer to form a second seal assembly, wherein step b-1) comprises installing the second seal assembly onto the fluid flow component so that the second seal is aligned with the second seal cavity of the first component, and wherein step c) further comprises positioning the component assembly in the first mounting location so that the second seal is aligned with the first seal cavity of the second substrate block and wherein step e) further comprises retracting the second seal retainer so that the second seal retainer is released from the fluid flow component.

4. The method of claim 1 wherein the first seal retainer comprises a seal aperture that receives the first seal.

5. The method of claim 4 wherein the first seal is an interference fit in the seal aperture and wherein the seal aperture engages an outer diameter of the first seal.

6. The method of claim 4 wherein the first seal retainer comprises a frangible zone, the frangible zone comprising a slot extending from the seal aperture.

7. The method of claim 1 wherein step e) further comprises rupturing the first seal retainer to release the first seal retainer.

8. The method of claim 1 wherein the first seal retainer comprises a gripping feature.

9. The method of claim 8 wherein the gripping feature is one of a plurality of circular apertures or a pair of elongate apertures spaced from one another.

10. The method of claim 1 wherein in step d), a mounting surface of the first substrate block and a mounting surface of the fluid flow component are separated by a first distance and wherein in step f) the mounting surface of the first substrate block and the mounting surface of the fluid flow component are separated by a second distance, wherein the first distance is greater than the second distance.

11. A method of installing a fluid flow component to an apparatus for controlling flow, the method comprising:
    a) positioning a component assembly atop a first substrate block, the component assembly comprising a fluid flow component, a first seal retainer, and a first seal retained by the first seal retainer in alignment with a first seal cavity of the fluid flow component, the component assembly positioned atop the first substrate block so that the first seal is aligned with a first seal cavity of the first substrate block;
    b) retracting the first seal retainer so that the first seal retainer is released from the fluid flow component while the first seal and the fluid flow component remain in position; and
    c) fastening the fluid flow component to the apparatus for controlling flow so that the first seal hermetically seals a flow path of the first substrate block to a flow path of the fluid flow component.

* * * * *